(12) United States Patent
Nagano

(10) Patent No.: US 6,335,647 B1
(45) Date of Patent: Jan. 1, 2002

(54) SKEW ADJUSTING CIRCUIT

(75) Inventor: Hideo Nagano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/814,869

(22) Filed: Mar. 23, 2001

(30) Foreign Application Priority Data

Oct. 20, 2000 (JP) .......................................... 12-320665

(51) Int. Cl.$^7$ ................................................. H03L 7/00
(52) U.S. Cl. ...................... 327/161; 327/235; 327/236; 327/252; 327/269
(58) Field of Search ................................ 327/161, 162, 327/163, 231, 233, 234, 235, 236, 246, 247, 252, 253, 269, 272, 274

(56) References Cited

U.S. PATENT DOCUMENTS

| | | | |
|---|---|---|---|
| 4,623,805 A | * 11/1986 | Flora et al. ................... | 327/269 |
| 4,637,018 A | * 1/1987 | Flora et al. ................... | 327/269 |
| 5,204,559 A | * 4/1993 | Deyhimy et al. ........... | 327/161 |
| 5,712,583 A | * 1/1998 | Frankeny ..................... | 327/158 |
| 6,127,874 A | * 10/2000 | Wakabayashi et al. ...... | 327/161 |

FOREIGN PATENT DOCUMENTS

JP          8-204694          8/1996

* cited by examiner

Primary Examiner—Timothy P. Callahan
Assistant Examiner—An T. Luu
(74) Attorney, Agent, or Firm—Burns, Doane, Swecker & Mathis, LLP

(57) ABSTRACT

A skew adjusting circuit can carry out optimum correction of skew by automatically reading skew amounts of transmission paths with a receiving-side IC, without setting particular skew amounts externally. The skew adjusting circuit includes delay generating circuits, a plurality sets of flip-flops, decoders and selectors. Each delay generating circuit is provided to one of channels, and includes delay elements, each of which has a same delay amount. Each set of the flip-flops is provided to one of the delay generating circuits except for a first delay generating circuit corresponding to a reference channel signal. The flip-flops of each set receive an output of a final delay element of the first delay generating circuit as a clock signal, and receive tap outputs of the associated one of the delay generating circuits. Each decoder receives outputs of the flip-flops of one of the sets of flip-flops. Each selector receives the output of one of the decoders as a control signal, receives tap outputs of one of the delay generating circuits, and outputs a skew corrected signal.

16 Claims, 14 Drawing Sheets

SKEW ADJUSTING CIRCUIT

BACKGROUND OF THE INVENTION

1. Field of the Invention

The present invention relates to a skew adjusting circuit, and more particularly to a skew adjusting circuit applicable to a high-speed data transmission system for adjusting delay difference between data transmission channels (inter-channel skew) on a data receiving side.

2. Description of Related Art

FIG. 16 is a block diagram showing a conventional skew adjusting circuit. In FIG. 16, the skew adjusting circuit 2000 comprises a transmitting-side printed-circuit board 2100 having a transmitting IC 2110 and wiring for transferring signals of the transmitting IC 2110, and a receiving-side printed-circuit board 2200 having a receiving IC 2210 and wiring for transferring signals of the receiving IC 2210. The transmitting IC 2110 includes a logic circuit 2111 and channel drivers Ch1–Chn, and the receiving IC 2210 includes channel receivers Ch1–Chn and a logic circuit 2211.

The skew circuit 2000 further comprises a transmitting-side connector 2120 for connecting wire of the transmitting-side printed-circuit board 2100, a receiving-side connector 2220 for connecting wire of the receiving-side printed-circuit board 2200, and a wire harness 2300 for interconnecting the transmitting-side connector 2120 and the receiving-side connector 2220.

When applying the skew adjusting circuit 2000 to a high-speed data transmission system, delay variations between channels can take place at the input of the receiving IC 2210 because of delay variations between channels of the transmitting IC 2110, delay variations between channels of the wire harness 2300, delay variations between channels of the connectors 2120 and 2220 and delay variations between channels due to wiring errors of the printed-circuit boards 2100 and 2200.

Thus, the conventional skew adjusting circuit 2000 can suffer from a malfunction (data error) when the inter-channel skew amounts to one bit.

To correct the variations at the receiving side, it must make fine adjustment of the skew on the printed-circuit board.

The adjustment has a problem of requiring an additional component for the adjustment, and being very difficult because of the extremely narrow bit width of the high-speed data transmission system.

SUMMARY OF THE INVENTION

The present invention is implemented to solve the foregoing problem. It is therefore an object of the present invention to provide a skew adjusting circuit capable of carrying out optimum correction of skew automatically by reading skew amounts, without setting particular skew amounts externally.

According to a first aspect of the present invention, there is provided a skew adjusting circuit comprising: a plurality of delay generating circuits, each of which is provided to one of channels, and includes a plurality of delay elements, each of the delay elements having a same delay amount; a plurality sets of flip-flops, each set of which is provided to one of the plurality of delay generating circuits except for a first delay generating circuit corresponding to a reference channel signal, the flip-flops of each set receive an output of a final delay element of the first delay generating circuit as a clock signal, and receive tap outputs of associated one of the plurality of delay generating circuits; a plurality of decoders, each of which receives outputs of the flip-flops of one of the plurality of sets of flip-flops; and a plurality of selectors, each of which receives an output of one of the plurality of decoders as a control signal, receives tap outputs of one of the plurality of delay generating circuits, and outputs a skew corrected signal.

The skew adjusting circuit may further comprise a plurality of latch circuits, each of which receives a skew mode signal as its clock signal, and an output of one of the plurality of decoders as its data input.

The skew adjusting circuit may further comprise a plurality of differential input circuits, each of which is provided to one of the channels, receives an external differential channel signal, and supplies its output to one of the plurality of delay generating circuits.

Each of the differential input circuits may comprise: a first first conductivity type MOS transistor having its source connected to a first fixed potential terminal; a first second conductivity type MOS transistor having its drain connected to a drain of the first first conductivity type MOS transistor, and its gate connected to a non-inverting input terminal of the differential input circuit; a second first conductivity type MOS transistor having its source connected to the first fixed potential terminal, its gate connected to the gate of the first first conductivity type MOS transistor, and its drain connected to its gate; a second second conductivity type MOS transistor having its drain connected to a drain of the second first conductivity type MOS transistor, and its gate connected to an inverting input terminal of the differential input circuit; a third second conductivity type MOS transistor having its source connected to a second fixed potential terminal, its drain connected to a source of the first second conductivity type MOS transistor and to a source of the second second conductivity type MOS transistor; a resistor having its first end connected to the first fixed potential terminal; and a fourth second conductivity type MOS transistor having its source connected to the second fixed potential terminal, its drain connected to a second end of the resistor, and its gate connected to its drain and to a gate of the third second conductivity type MOS transistor.

Each of the plurality of delay generating circuits may consist of a differential delay generating circuit that is supplied with an external differential channel signal, amplifies a difference voltage across its two input terminals, and outputs a voltage corresponding to the difference voltage.

Each of the differential delay generating circuit may comprise delay elements, each of which includes an operational amplifier.

Each of the differential delay generating circuit may comprise: a plurality of first resistors having their first ends connected to a first fixed potential terminal; a plurality of second resistors having their first ends connected to the first fixed potential terminal, each of the plurality of second resistors being paired with one of the plurality of first resistors; a plurality of first NMOS transistors, each of which has its drain connected a second end of one of the plurality of first resistors; a plurality of second NMOS transistors, each of which has its drain connected to a second end of one of the plurality of second resistors; a plurality of third NMOS transistors, each of which has its source connected to a second fixed potential terminal, and its drain connected to sources of the first and second NMOS transistors that are paired; a third resistor having its first end connected to the first fixed potential terminal; and a fourth NMOS transistor having its source connected to the second fixed potential terminal, its drain connected to a second end of the third resistor, and its gate connected to gates of the plurality of third NMOS transistors.

Each of the plurality of delay generating circuits may include a plurality of bias circuits for adjusting the delay amount of the delay elements.

Each of the plurality of delay generating circuits may comprise: a delay adjuster including a first resistor having its end connected to a first fixed potential terminal, a second resistor having its first end connected to a second end of the first resistor, and a third resistor having its first end connected to a second end of the second resistor and its second end connected to a second fixed potential terminal; a plurality of first conductivity type MOS transistors, each of which has its source connected to the first fixed potential terminal, and its gate connected to a connecting point of the first resistor and the second resistor; a plurality of bias circuits, each of which is connected to a drain of one of the plurality of first conductivity type MOS transistors; and a plurality of second conductivity type MOS transistors, each of which has its source connected to the second fixed potential terminal, its drain connected to one of the plurality of bias circuit, and its gate connected to a connecting point of the second resistor and the third resistor.

Each of the delay generating circuits may include an increasing number of delay elements and an increasing number of flip-flops corresponding to the delay elements.

According to a second aspect of the present invention, there is provided a skew adjusting circuit comprising: a plurality of delay generating circuits, each of which is provided to one of channels, and includes a plurality of delay elements, each of the delay elements having a same delay amount; at least one phase comparator that receives a reference channel signal and another channel signal; at least one first charge pump that receives an Up signal from the phase comparator; at least one first filter that receives an output of the first charge pump; at least one first ADC (analog-to-digital converter) that receives an output of the first filter as an analog input, and receives the reference channel signal as a clock signal; at least one first decoder that receives an output of the first ADC; at least one first latch circuit that receives a skew mode signal as a clock signal, and an output of the first decoder as a data input; at least one first selector that receives an output of the first latch circuit as a control signal, receives tap outputs of one of the plurality of delay generating circuits, and outputs a skew corrected signal of the reference channel signal; at least one second charge pump that receives a Down signal from the phase comparator; at least one second filter that receives an output of the second charge pump; at least one second ADC that receives an output of the second filter as an analog input, and receives the reference channel signal as a clock signal; at least one second decoder that receives an output of the second ADC; at least one second latch circuit that receives the skew mode signal as a clock signal, and an output of the second decoder as a data input; and at least one second selector that receives an output of the second latch circuit as a control signal, receives tap outputs of one of the plurality of delay generating circuits, and outputs a skew corrected signal of the channel signal.

Here, the skew adjusting circuit may further comprise a plurality of differential input circuits, each of which is provided to one of the channels, receives an external differential channel signal, and supplies its output to one of the plurality of delay generating circuits.

Each of the plurality of delay generating circuits may consist of a differential delay generating circuit that is supplied with an external differential channel signal, amplifies a difference voltage across its two input terminals, and outputs a voltage corresponding to the difference voltage.

Each of the differential delay generating circuits may comprise delay elements, each of which includes an operational amplifier.

Each of the plurality of delay generating circuits may include a plurality of bias circuits for adjusting the delay amount of the delay elements.

Each of the delay generating circuits may include an increasing number of delay elements and an increasing number of flip-flops corresponding to the delay elements.

DETAILED DESCRIPTION OF THE PREFERRED EMBODIMENTS

The invention will now be described with reference to the accompanying drawings.

Embodiment 1

Figure 1:
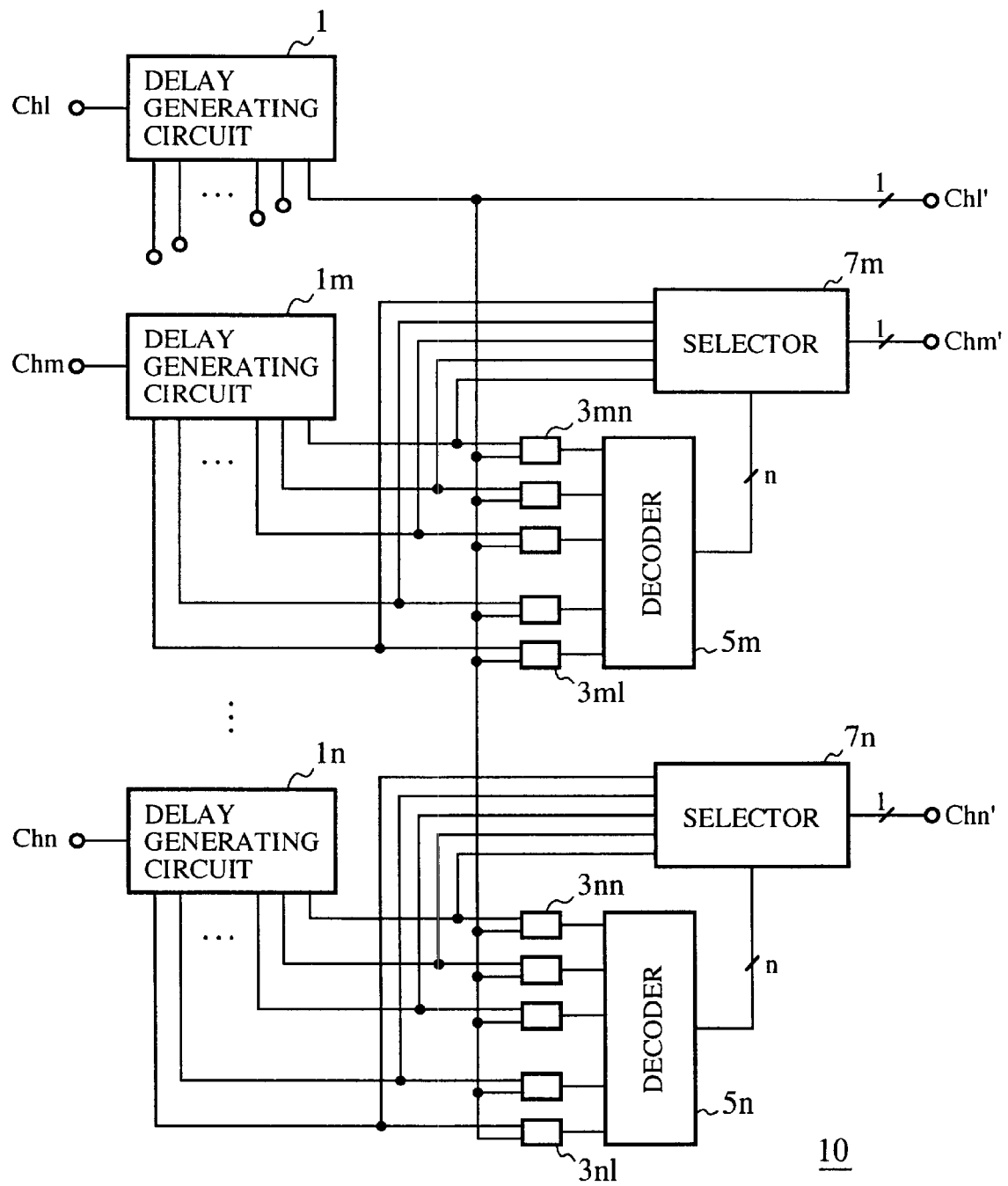
FIG. 1 is a block diagram showing a configuration of an embodiment 1 of a skew adjusting circuit in accordance with the present invention.

FIG. 1 is a block diagram showing a configuration of an embodiment 1 of a skew adjusting circuit in accordance with the present invention. In FIG. 1, the skew adjusting circuit 10 comprises delay generating circuits 1 and 1m–1n, each including a plurality of delay elements each of which has the same delay amount.

The delay generating circuits 1, 1m–1n are provided for the channels, respectively, in such a manner that the output of the final stage delay element of the delay generating circuit 1, for example, becomes a skew corrected signal Ch1' of the reference channel signal Ch1.

The delay generating circuits 1m–1n other than the delay generating circuit 1 are provided with flip-flops 3m1–3mn, ..., and 3n1–3nn, respectively, to which the tap outputs of the delay generating circuits 1m–1n are supplied, along with the output Ch' of the delay generating circuit 1 functioning as a clock signal.

The skew adjusting circuit 10 further comprises decoders 5m–5n and selectors 7m–7n, respectively. The decoders 5m–5n are supplied with the outputs of the flip-flops 3m1–3mn, ..., and 3n1–3nn, respectively. The selectors 7m–7n receive the tap outputs of the delay generating circuits 1m–1n along with the output of the decoders 5m–5n functioning as their control signals, and output skew corrected signals Chm'–Chn' of the channel signals Chm–Chn, respectively.

Figure 2:
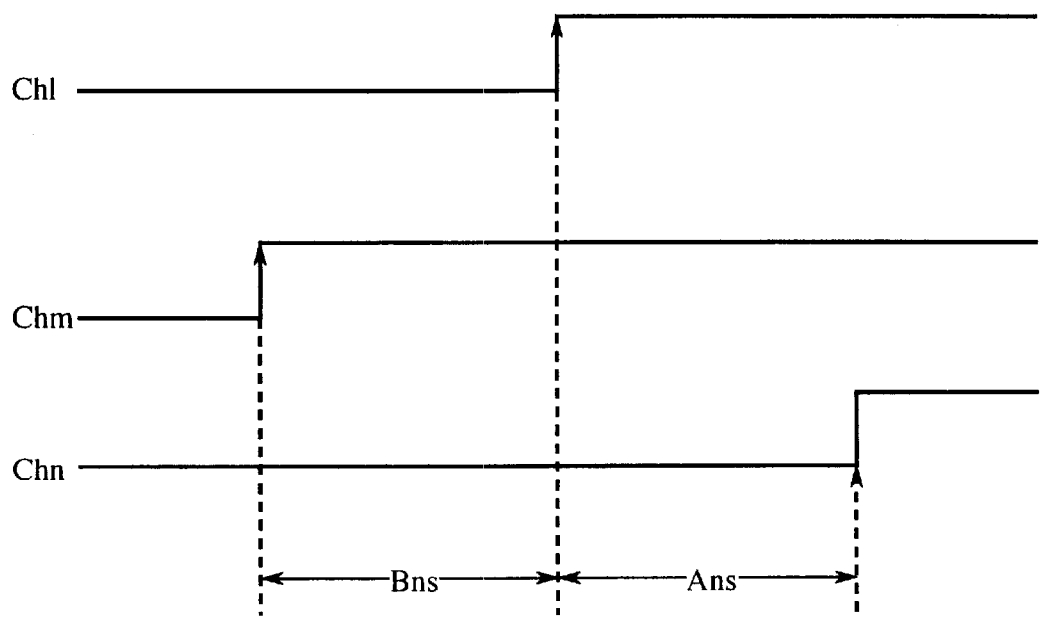
FIG. 2 is a timing chart illustrating channel signals of the embodiment 1.

Next, the operation of the skew adjusting circuit 10 will be described with reference to FIG. 2, a timing chart illustrating the channel signals of the present embodiment 1. The timing chart of FIG. 2 illustrates a case in which the channel signal Chm advances by Bns and the channel signals Chn lags by Ans with respect to the reference channel signal Ch1.

Figure 3:
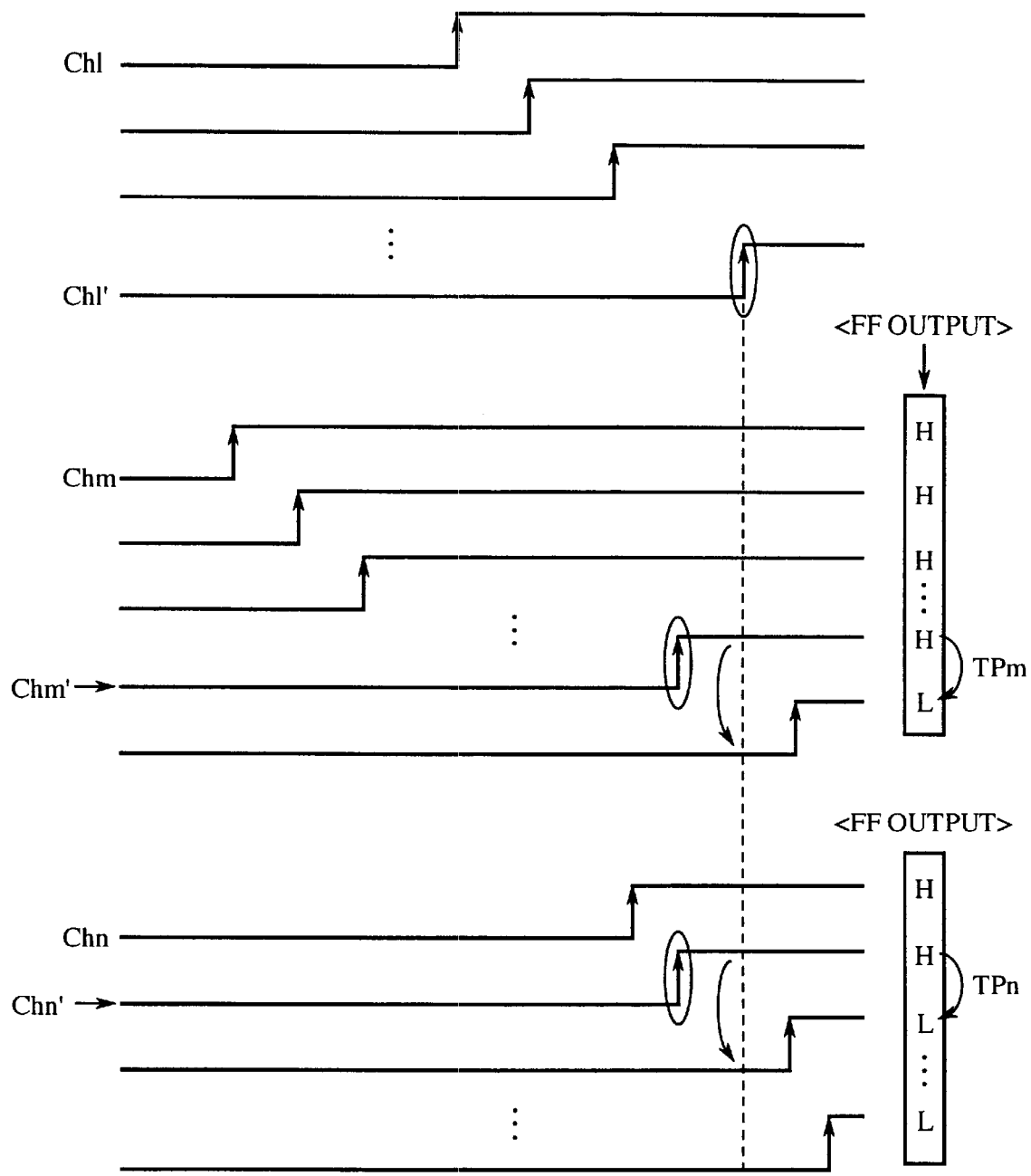
FIG. 3 is a timing chart illustrating inter-channel skew of the embodiment 1.

FIG. 3 is a timing chart illustrating the inter-channel skew of the skew adjusting circuit 10. As for the channel signal Chn lagged behind the reference channel signal Ch1, the outputs of the delay elements of the delay generating circuit 1n are supplied to the data input terminals of the flip-flops 3n1–3nn that receive the skew corrected signal Ch1' of the reference channel signal Ch1 as their clock signal. The <FF outputs> of FIG. 3 corresponding to the channel signal Chn illustrates the state of the outputs of the flip-flops 3n1–3nn in this case.

The <FF outputs> indicates that the outputs of the flip-flops 3n1–3nn have a transition TPn from the "H" (high) to "L" (low) level, which means that it serves to detect an edge position of the channel signals Chn.

Receiving the outputs of the flip-flops 3n1–3nn, the decoder 5n selects the output of the delay element which is closest to the timing of the skew corrected signal Ch1' from among the delay elements of the delay generating circuit 1n.

Likewise, as for the channel signal Chm leading the reference channel signal Ch1, the output of the delay elements of the delay generating circuit 1m are supplied to the data input terminals of the flip-flop 3m1–3mn which receive the skew corrected signal Ch1' of the reference channel signal Ch1 as the clock signal. The operation in this case is analogous to the operation for the channel signal Chn.

As the outputs of the skew adjusting circuit 10, the skew corrected signals Ch1', Chm' and Chn' are obtained from the reference channel signal Ch1, and from the channel signals Chm and Chn.

Thus, although the reference channel signal Ch1 and the channel signals Chm–Chn have the skew, the signals Ch1' and Chm'–Chn' after the skew correction of the reference channel signal Ch1 and channel signals Chm–Chn include no skew.

As described above, the present embodiment 1 corrects the skew of the channel signals Chm–Chn such that they match the skew corrected signal Ch1' of the reference channel signal Ch1. Thus, it can correct the skew within a one-bit data period of the LVDS (Low Voltage Differential Signaling) and the like used in the high-speed data transmission system. In addition, since the outputs of the decoders are directly connected to the selectors as their control signals, the delay amount of the received data are optimized automatically each time the received data is input.

Embodiment 2

Figure 4:
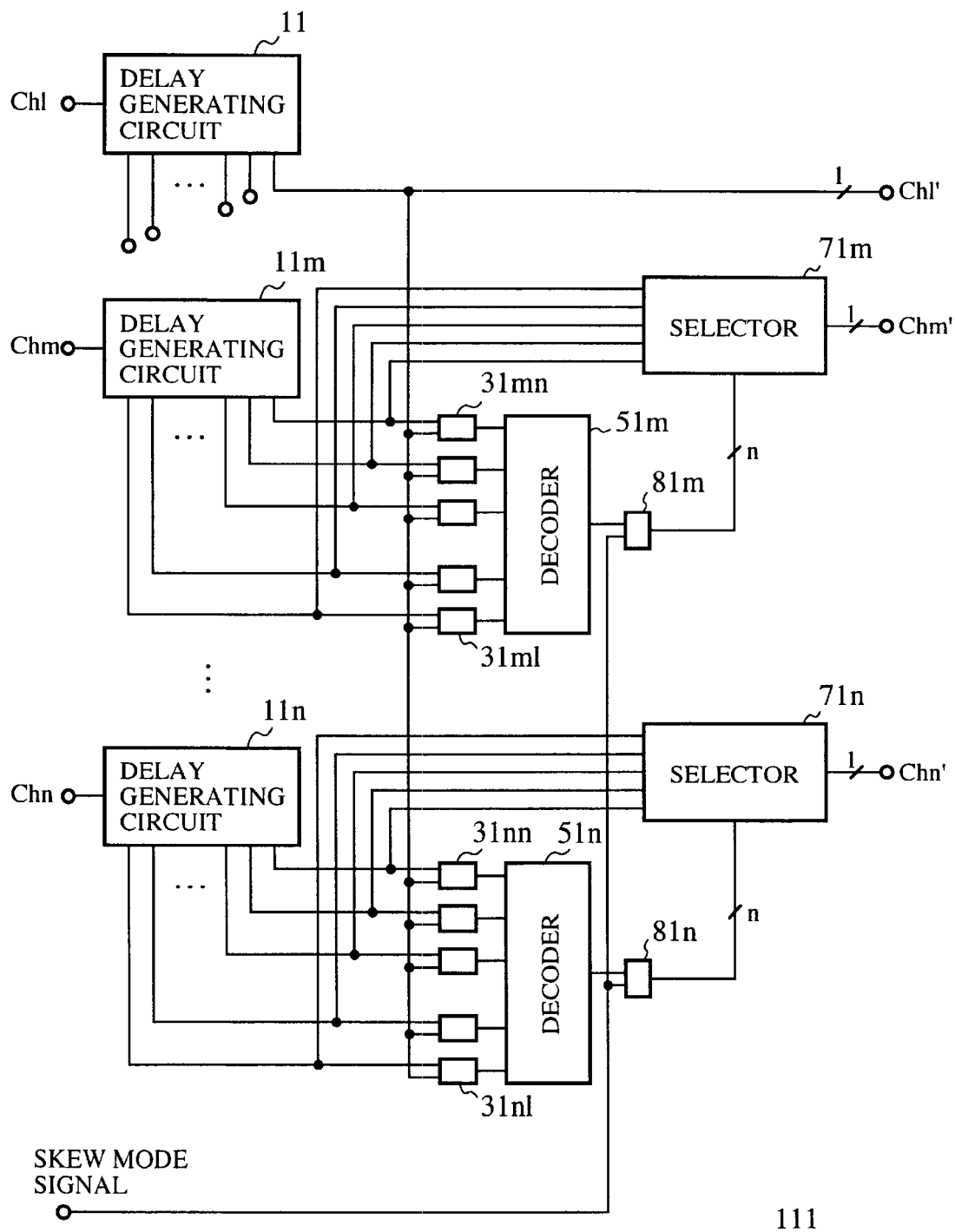
FIG. 4 is a block diagram showing a configuration of an embodiment 2 of the skew adjusting circuit in accordance with the present invention.

FIG. 4 is a block diagram showing a configuration of an embodiment 2 of the skew adjusting circuit in accordance with the present invention. In FIG. 4, the skew adjusting circuit 111 comprises delay generating circuits 11 and 11m–11n, each including a plurality of delay elements each of which has the same delay amount.

The delay generating circuits 11, 11m–11n are provided for the channels, respectively, in such a manner that the output of the final stage delay element of the delay generating circuit 11, for example, becomes a skew corrected signal Ch1' of the reference channel signal Ch1.

The delay generating circuits 11m–11n other than the delay generating circuit 11 are provided with flip-flops 31m1–31mn, ..., and 31n1–31nn, respectively, to which the tap outputs of the delay generating circuits 11m–11n are supplied along with the output Ch' of the delay generating circuit 11 functioning as a clock signal.

The skew adjusting circuit 111 further comprises decoders 51m–51n, latch circuits 81m–81n and selectors 71m–71n, respectively. The decoders 51m–51n are supplied with the outputs of the flip-flops 31m1–31mn, ..., and 31n1–31nn, respectively. The latch circuits 81m–81n receive a skew mode signal as their clock signal, and the outputs of the decoders 51m–51n as their data inputs. The selectors 71m–71n receive the tap outputs of the delay generating circuits 11m–11n along with the outputs of the latch circuits 81m–81n as their control signals, and output skew corrected signals Chm'–Chn' of the channel signals Chm–Chn, respectively.

Thus, the skew adjusting circuit 111 is a system that can set a skew adjusting period enabling skew adjustment only in that period, and holds the adjusted result obtained in the skew adjusting period throughout an actual operation. To achieve this, the skew adjusting circuit 111 comprises the skew mode signal, a selecting signal for setting the skew adjusting period, and the latch circuits interposed between the decoders and selectors.

The skew adjusting circuit 111 operates as follows. When the skew mode signal is placed at the "L" level, it establishes the skew adjusting period. Assume that the latch circuits are placed in a through state at the "L" level, and in a latch state at the "H" level. While the skew mode signal is at the "L" level, since the skew mode signal is supplied to the clock terminals of the latch circuits 81m–81n, the output signals of the decoders 51m–51n pass through the latch circuits, and are supplied to the control terminals of the selectors 71m–71n.

During that period, the skew adjustment is carried out continuously, during which it is necessary for a transmitting side to transmit signals with a simultaneous rising edge to the receiving-side IC to enable the skew adjustment.

When shifting to the actual operation after the skew adjusting period, the skew mode signal is changed from the "L" level to the "H" level so that the latch circuits can hold the decode signals established in the skew adjusting period.

Specifically, the latch circuits 81m–81n are brought into the hold state to retain the decoded signal determined while the skew mode signal is placed at the "L" level.

Thus, even in the actual operation mode, they can hold the set values of the delay generating circuits 11m–11n determined during the skew adjusting period.

The remaining operation is the same as that of the foregoing embodiment 1.

Since the present embodiment 2 sets the skew adjusting period enabling the skew adjustment only during that period, and holds the adjusted result obtained during the skew adjusting period throughout the actual operation, the delay amounts can be optimized more accurately.

Embodiment 3

Figure 5:
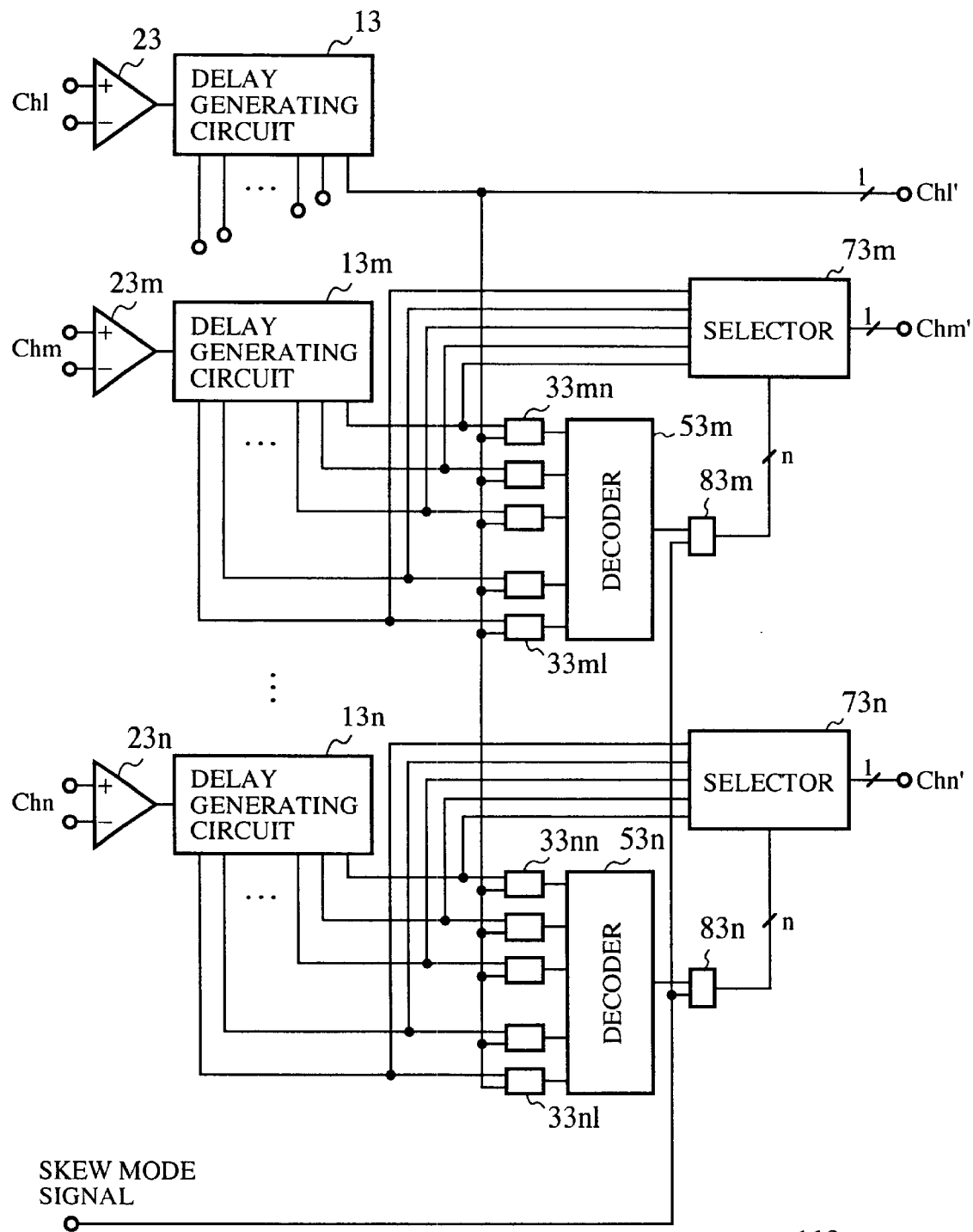
FIG. 5 is. a block diagram showing a configuration of an embodiment 3 of the skew adjusting circuit in accordance with the present invention.

FIG. 5 is a block diagram showing a configuration of an embodiment 3 of the skew adjusting circuit in accordance with the present invention. In FIG. 5, a skew adjusting circuit 113 comprises delay generating circuits 13 and 13m–13n, each including a plurality of delay elements each of which has the same delay amount.

The delay generating circuits 13, 13m–13n are provided for the channels, respectively, in such a manner that the output of the final stage delay element of the delay generating circuit 13, for example, becomes a skew corrected signal Ch1' of the reference channel signal Ch1.

The delay generating circuits 13m–13n other than the delay generating circuit 13 are provided with flip-flops 33m1–33mn, ..., and 33n1–33nn, respectively, to which the tap outputs of the delay generating circuits 13m–13n are supplied along with the output Ch' of the delay generating circuit 13 functioning as a clock signal.

The skew adjusting circuit 113 further comprises decoders 53m–53n, latch circuits 83m–83n and selectors 73m–73n, respectively. The decoders 53m–53n are supplied with the outputs of the flip-flops 33m1–33mn, ..., and 33n1–33nn, respectively. The latch circuits 81m–81n receive a skew mode signal as their clock signal, and the outputs of the decoders 53m–53n as their data inputs. The selectors 73m–73n receive the tap outputs of the delay generating circuits 13m–13n, along with the outputs of the latch circuits 83m–83n as their control signals, and output the skew corrected signals Chm'–Chn' of the channel signals Chm–Chn, respectively.

The skew adjusting circuit 113 further comprises differential input circuits 23 and 23m–23n that are provided for individual channels, receive differential channel signals from the outside (from a circuit other than the skew adjusting circuit 113), and supply channel signals to the delay generating circuits 13 and 13m–13n.

Figure 6:
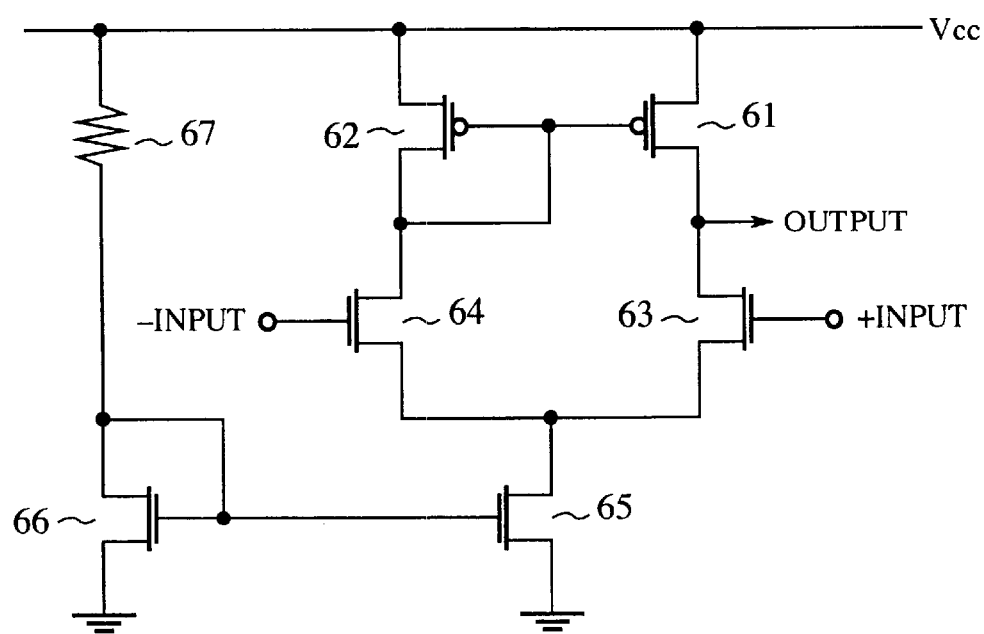
FIG. 6 is a circuit diagram showing a configuration of a delay generating circuit of the embodiment 3.

FIG. 6 is a circuit diagram showing a configuration of the differential input circuit 23, for example. The differential input circuit 23 comprises a PMOS transistor 61 having its source connected to a supply voltage Vcc, and an NMOS transistor 63 having its drain connected to the drain of the PMOS transistor 61 and its gate connected to the non-inverting input terminal of the differential input circuit.

The differential input circuit 23 further comprises a PMOS transistor 62 having its source connected to the supply voltage Vcc and its gate connected to the gate of the PMOS transistor 61, and an NMOS transistor 64 having its drain connected to the drain of the PMOS transistor 62, and its gate connected to the inverted input terminal of the differential input circuit.

The differential input circuit 23 further comprises an NMOS transistor 65 having its source connected to a ground and its drain connected to the sources of the NMOS transistors 63 and 64, a resistor 67 having its first end connected to the supply voltage Vcc, and an NMOS transistor 66 having its source connected to the ground, its drain connected to the second end of the resistor 67 and its gate connected to the gate of the NMOS transistor 65. The drain of the NMOS transistor 66 is also connected to its gate.

The remaining differential input circuits 23m–23n have the same configuration as the differential input circuit 23.

Thus, the skew adjusting circuit 113 is an inter-channel skew adjusting circuit including the differential input circuits, and applicable to the differential interface such as the LVDS.

As for the operation of the skew adjusting circuit 113, the differential input circuits 23 and 23m–23n with the foregoing configuration convert the differential signals to single-ended signals, and supply the single-ended signals to the delay generating circuits 13 and 13m–13n.

Accordingly, the operation of the present embodiment 3 is the same as that of the embodiment 2 after the outputs of the differential input circuits 23 and 23m–23n.

The present embodiment 3 can implement faster operation than the embodiment 2.

Embodiment 4

Figure 7:
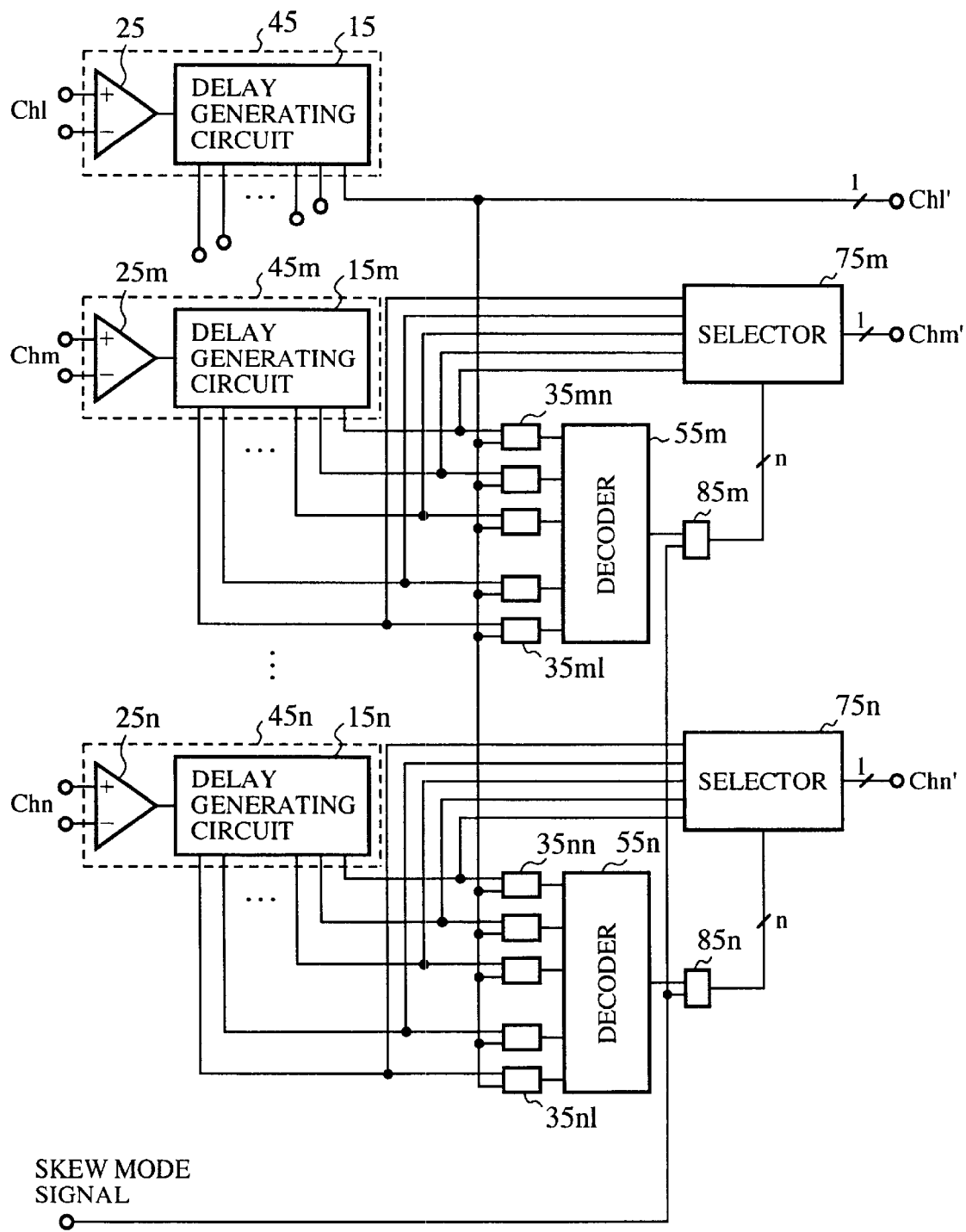
FIG. 7 is a block diagram showing a configuration of an embodiment 4 of the skew adjusting circuit in accordance with the present invention.

FIG. 7 is a block diagram showing a configuration of an embodiment 4 of the skew adjusting circuit in accordance with the present invention. In FIG. 7, a skew adjusting circuit 115 comprises delay generating circuits 15 and 15m–15n, each including a plurality of delay elements each of which has the same delay amount.

The delay generating circuits 15, 15m–15n are provided for the channels, respectively, in such a manner that the output of the final stage delay element of the delay generating circuit 15, for example, becomes a skew corrected signal Ch1' of the reference channel signal Ch1.

The delay generating circuits 15m–15n other than the delay generating circuit 15 are provided with flip-flops 35m1–35mn, ..., and 35n1–35nn, respectively, to which the tap outputs of the delay generating circuits 15m–15n are supplied along with the output Ch' of the delay generating circuit 15 functioning as a clock signal.

The skew adjusting circuit 115 further comprises decoders 55m–55n, latch circuits 85m–85n and selectors 75m–75n, respectively. The decoders 55m–55n are supplied with the outputs of the flip-flops 35m1–35mn, ..., and 35n1–35nn, respectively. The latch circuits 85m–85n receive a skew mode signal as their clock signal, and the outputs of the decoders 55m–55n as their data inputs. The selectors 75m–75n receive the tap outputs of the delay generating circuits 15m–15n, along with the outputs of the latch circuits 85m–85n functioning as their control signals, and output skew corrected signals Chm'–Chn' of the channel signals Chm–Chn, respectively.

The skew adjusting circuit 115 further comprises differential delay generating circuits 45 and 45m–45n which include differential input circuits 25 and 25m–25n and the delay generating circuits 15 and 15m–15n, respectively. The differential input circuits 25 and 25m–25n are provided for individual channels, receive differential channel signals from the outside (from a circuit other than the skew adjusting circuit 115), and supply channel signals to the delay generating circuits 15 and 15m–15n.

Figure 8:
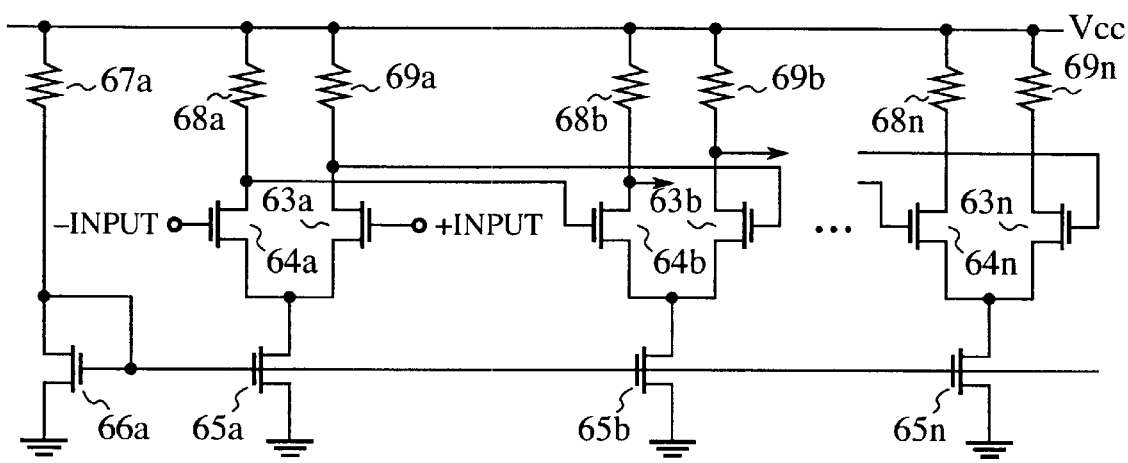
FIG. 8 is a circuit diagram showing a configuration of a delay generating circuit of the embodiment 4.

FIG. 8 is a circuit diagram showing a configuration of the differential delay generating circuit 45, for example. In FIG. 8, the differential delay generating circuit 45 comprises resistors 69a and 69b–69n having their first ends connected to the supply voltage Vcc; an NMOS transistor 63a having its drain connected to the second end of the resistor 69a and its gate connected to the non-inverting input terminal of the differential delay generating circuit; and NMOS transistors 63b–63n having their drain connected to the second ends of the resistors 69b–69n, respectively.

The differential delay generating circuit 45 further comprises resistors 68a and 68b–68n having their first ends connected to the supply voltage Vcc; an NMOS transistor 64a having its drain connected to the second end of the resistor 68a and its gate connected to the inverting input terminal of the differential delay generating circuit; and NMOS transistors 64b–64n having their drain connected to the second ends of the resistors 68b–68n, respectively.

The differential delay generating circuit 45 further comprises NMOS transistors 65a and 65b–65n having their sources connected to the ground and their drains connected to the sources of the NMOS transistors 63a and 63b–63n and 64a and 64b–64n; a resistor 67a having its first end connected to the supply voltage Vcc; and an NMOS transistor 66a having its source connected to the ground, its drain connected to the second end of the resistor 67a and its gate connected to the gates of the NMOS transistors 65a and 65b–65n. The drain of the NMOS transistor 66a is also connected to its gate.

The NMOS transistor 63b has its gate connected to the drain of the NMOS transistor 63a, and the following stage NMOS transistors 63c–63n have their gates connected to the drains of the previous NMOS transistors 63b–63(n−1), respectively.

Likewise, the NMOS transistor 64b has its gate connected to the drain of the NMOS transistor 64a, and the following stage NMOS transistors 64c–64n have their gates connected to the drains of the previous NMOS transistors 64b–64(n−1), respectively.

The remaining differential delay generating circuits 45m–45n have the same configuration as described above.

Thus, the skew adjusting circuit 115, which applies the differential input circuits to the delay generating circuits, is applicable to the differential transmission such as the LVDS employed in a high-speed data transmission system.

As for the operation of the skew adjusting circuit 115, since the delay elements of the differential delay generating circuits 45 and 45m–45n are composed of operational amplifiers that amplify the differential voltage between the two inputs, they can detect the differential voltages in spite of external noise imposed on the signal lines, thereby making it possible to implement highly accurate delay lines.

Furthermore, they can implement faster operation than the inverting type delay elements because their signals do not swing in their full range.

The present embodiment 4 can implement a low-noise, high-speed skew adjusting circuit.

Embodiment 5

Figure 9:
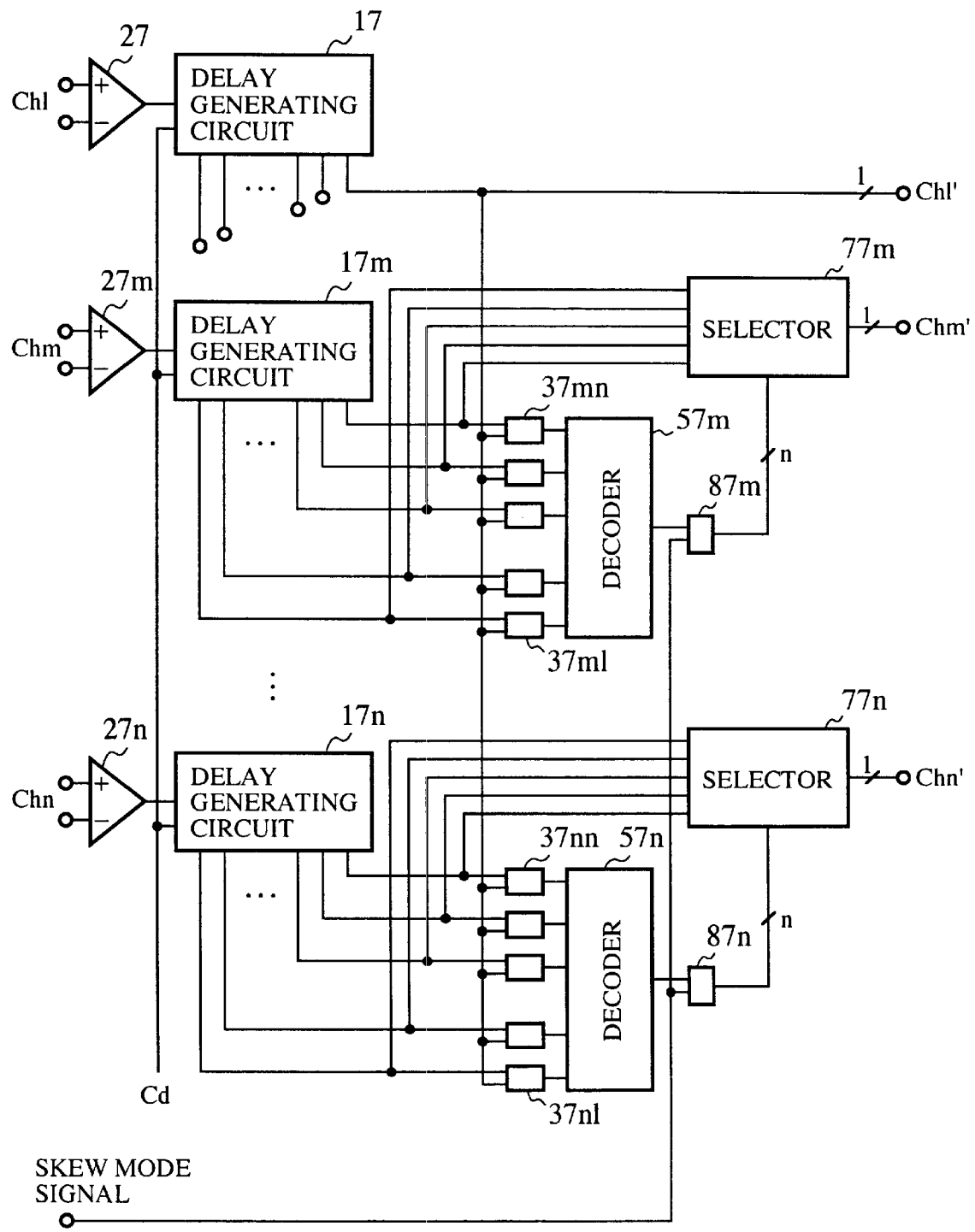
FIG. 9 is a block diagram showing a configuration of an embodiment 5 of the skew adjusting circuit in accordance with the present invention.

FIG. 9 is a block diagram showing a configuration of an embodiment 5 of the skew adjusting circuit in accordance with the present invention. In FIG. 9, the skew adjusting circuit 117 comprises delay generating circuits 17 and 17m–17n, each including a plurality of delay elements each of which has the same delay amount.

The delay generating circuits 17, 17m–17n are provided for the channels, respectively, in such a manner that the output of the final stage delay element of the delay generating circuit 17, for example, becomes a skew corrected signal Ch1' of the reference channel signal Ch1.

The delay generating circuits 17m–17n other than the delay generating circuit 17 are provided with flip-flops 37m1–37mn, . . . , and 37n1–37nn, respectively, to which the tap outputs of the delay generating circuits 17m–17n are supplied along with the output Ch' of the delay generating circuit 17 functioning as a clock signal.

The skew adjusting circuit 117 further comprises decoders 57m–57n, latch circuits 87m–87n and selectors 77m–77n, respectively. The decoders 57m–57n are supplied with the outputs of the flip-flops 37m1–37mn, . . . , and 37n1–37nn, respectively. The latch circuits 87m–87n receive a skew mode signal as their clock signal, and the outputs of the decoders 57m–57n as their data inputs. The selectors 77m–77n receive the tap outputs of the delay generating circuits 17m–17n, along with the outputs of the latch circuits 87m–87n as their control signals, and output skew corrected signals Chmz'–Chn' of the channel signals Chm–Chn, respectively.

The skew adjusting circuit 117 further comprises differential input circuits 27 and 27m–27n that are provided for individual channels, receive differential channel signals from the outside (from a circuit other than the skew adjusting circuit 117), and supply channel signals to the delay generating circuits 17 and 17m–17n.

Figure 10:
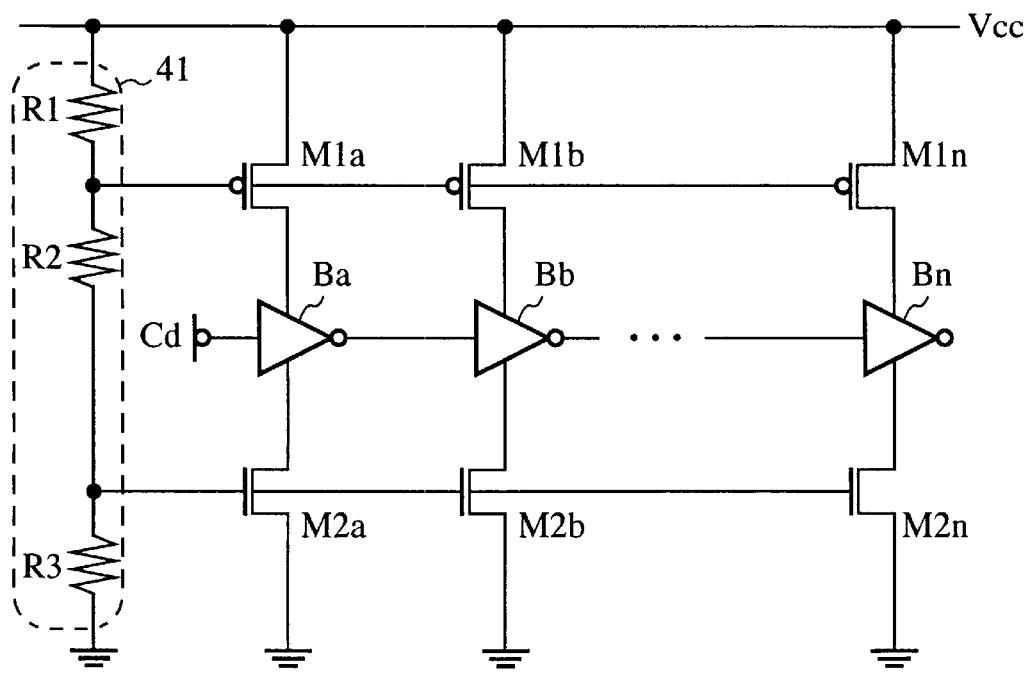
FIG. 10 is a circuit diagram showing a configuration of a delay generating circuit of the embodiment 5.

FIG. 10 is a circuit diagram showing a configuration of the differential input circuit 17, for example. The differential input circuit 17 comprises a delay adjuster 41 that includes a resistor R1 having its first end connected to the supply voltage Vcc, a resistor R2 having its first end connected to the second end of the resistor R1 and a resistor R3 having its first end connected to the second end of the resistor R2 and its second end connected to the ground.

The differential input circuit 17 further comprises PMOS transistors M1a and M1b–M1n having their sources connected to the supply voltage Vcc and their gates connected to the connecting point of the resistors R1 and R2.

The differential input circuit 17 further comprises bias circuits Ba and Bb–Bn connected to the drains of the PMOS transistors M1a and M1b–M1n, respectively.

The differential input circuit 17 further comprises NMOS transistors M2a and M2b–M2n having their sources connected to the ground, and their drains connected to the bias circuits Ba and Bb–Bn, respectively.

The remaining delay generating circuits 17m–17n have the same configuration as described above.

The present embodiment 5 can implement a system applicable to the differential transmission like the LVDS used for a high-speed data transmission system that can correct the skew amounting to about one bit.

As for the operation of the skew adjusting circuit 117, the delay amounts of the delay generating circuits 17m–17n are determined by delay amount setting voltages determined by the divided voltages by the resistors R1–R3 that determine the delay of the delay generating circuits 17m–17n. To determine the delay amounts of the delay generating circuits 17m–17n by only the delay amount setting voltages, it is necessary for the PMOS transistors M1a and M1b–M1n and the NMOS transistors M2a and M2b–M2n to be biased to their saturation regions.

The present embodiment 5 enables the delay amount from the reference channel signal Ch1 to the skew corrected signal Ch1' to be increased by increasing the delay of the delay generating circuit. Since the skew corrected signal Ch1' serves as the reference signal of the skew adjustment, the present embodiment 5 can increase the adjustable skew range.

Embodiment 6

Figure 11:
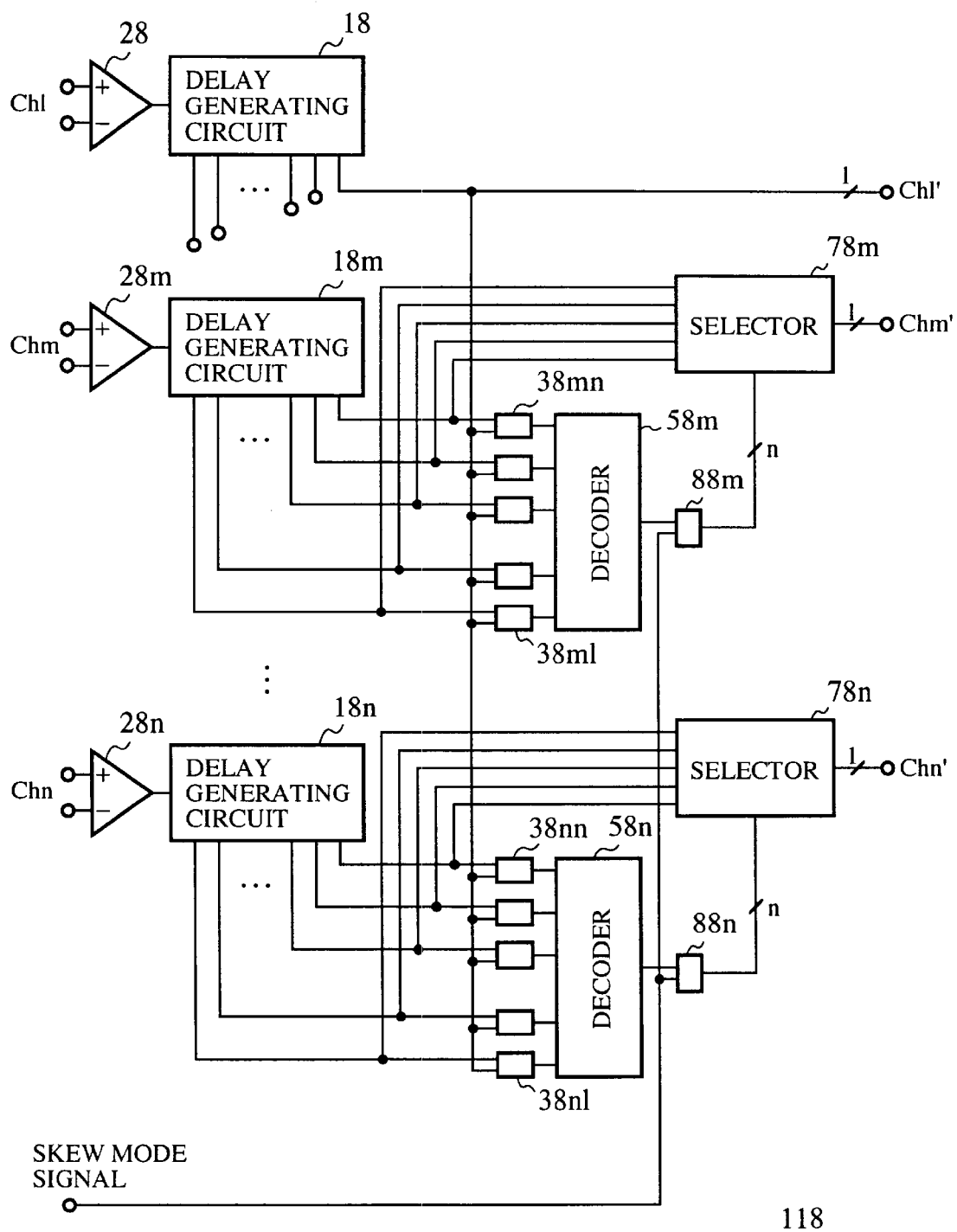
FIG. 11 is a block diagram showing a configuration of an embodiment 6 of the skew adjusting circuit in accordance with the present invention.

FIG. 11 is a block diagram showing a configuration of an embodiment 6 of the skew adjusting circuit in accordance with the present invention. In FIG. 11, the skew adjusting circuit 118 comprises delay generating circuits 18 and 18m–18n, each including a plurality of delay elements each of which has the same delay amount.

The delay generating circuits 18 and 18m–18n have a delay amount adjustable range greater than that of the delay generating circuits of the other embodiments because of the greater number of their delay elements.

The delay generating circuits 18, 18m–18n are provided for the channels, respectively, in such a manner that the output of the final stage delay element of the delay generating circuit 18, for example, becomes a skew corrected signal Ch1' of the reference channel signal Ch1.

The delay generating circuits 18m–18n other than the delay generating circuit 18 are provided with flip-flops 38m1–38mn, . . . , and 38n1–38nn, respectively, to which the tap outputs of the delay generating circuits 18m–18n are supplied along with the output Ch' of the delay generating circuit 18 functioning as a clock signal.

The number of the flip-flops 38m1–38mn, . . . , or 38n1–38nn is increased by the increased number of the delay elements, to widen the delay adjustable range as compared with that of the flip-flops of the other embodiments.

The skew adjusting circuit 118 further comprises decoders 58m–58n, latch circuits 88m–88n and selectors 78m–78n, respectively. The decoders 58m–58n are supplied with the outputs of the flip-flops 38m1–38mn, . . . , and 38n1–38nn, respectively. The latch circuits 88m–88n receive a skew mode signal as their clock signal, and the outputs of the decoders 58m–58n as their data inputs. The selectors 78m–78n receive the tap outputs of the delay generating circuits 18m–18n, along with the outputs of the latch circuits 88m–88n as their control signals, and output skew corrected signals Chm'–Chn' of the channel signals Chm–Chn, respectively.

The skew adjusting circuit 118 further comprises differential input circuits 28 and 28m–28n that are provided for individual channels, receive differential channel signals from the outside (from a circuit other than the skew adjusting circuit 118), and supply channel signals to the delay generating circuits 18 and 18m–18n.

The present embodiment 6 can implement a system applicable to the differential transmission like the LVDS used for a high-speed data transmission system that can carry out the skew adjustment at every 1/5 step of a one-bit pattern.

The skew adjusting circuit 118 is characterized by increasing the delay elements of the delay generating circuits 18 and 18m–18n. The number of the delay elements is increased to enable the inter-channel variations of the skew adjusting circuit to be adjusted more finely because a smaller skew adjusting step, that is, a smaller minimum pitch of the adjustment, enables finer adjustment.

In addition, since an increasing number of the delay elements of the delay generating circuits 18 and 18m–18n increases the number of the delay lines selectable by the decoders, it can make the adjustable pitch smaller.

It is necessary for the flip-flops 38m1–38mn, . . . , and 38n1–38nn to increase their number by the increased number of the delay elements of the delay generating circuits 18 and 18m–18n.

The present embodiment 6 can implement a skew adjusting circuit capable of achieving fine adjustment of the skew.

Embodiment 7

Figure 12:
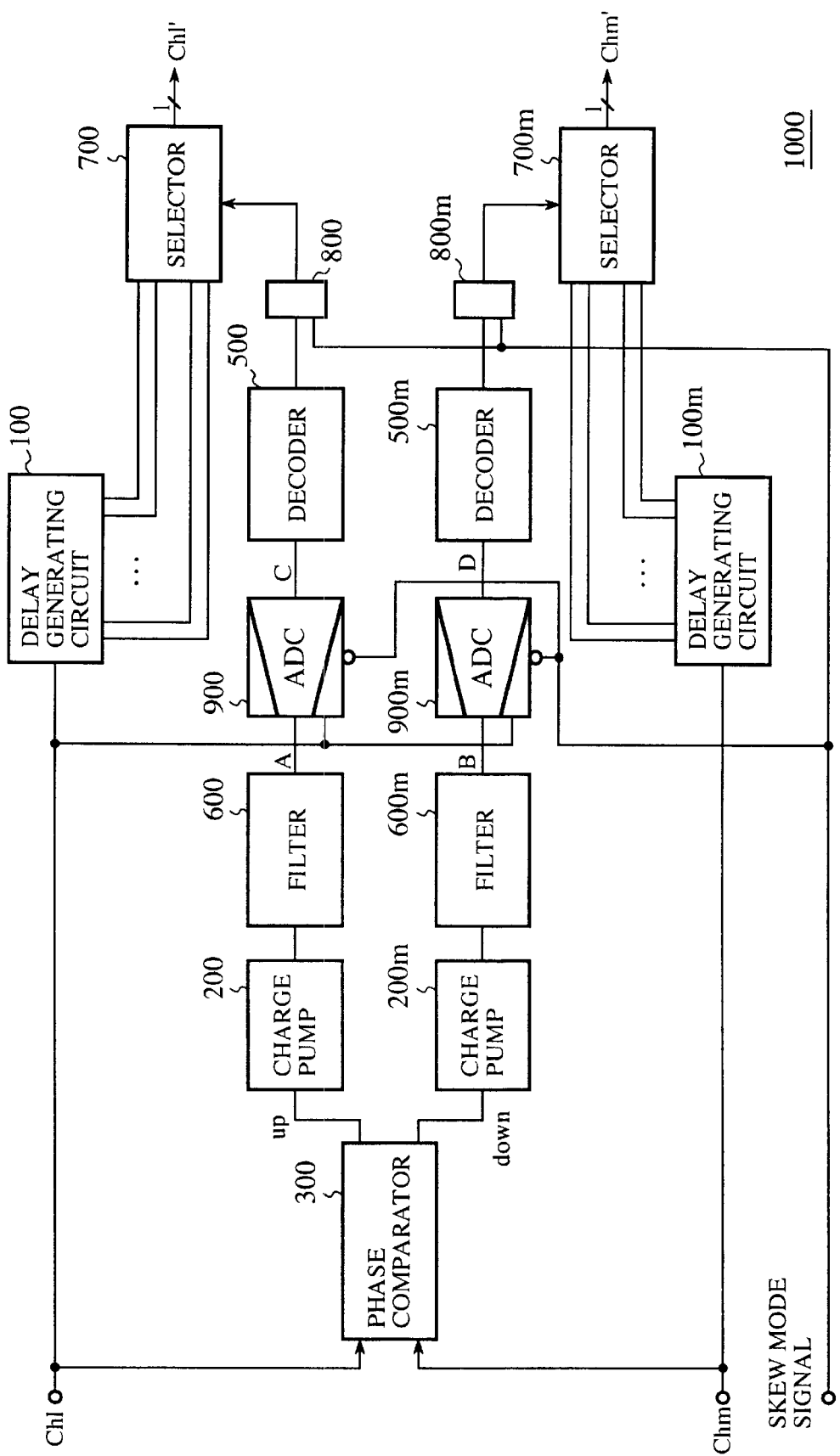
FIG. 12 is a block diagram showing a configuration of an embodiment 7 of the skew adjusting circuit in accordance with the present invention.

FIG. 12 is a block diagram showing a configuration of an embodiment 7 of the skew adjusting circuit in accordance with the present invention. In FIG. 12, the skew adjusting circuit 1000 comprises delay generating circuits 100–100m that are provided for individual channels, and include a plurality of delay elements, each of which has the same delay amount.

The skew adjusting circuit of FIG. 12 carries out the skew adjustment not among many channels, but between two channels whose input stages include a phase comparator.

For example, a phase comparator 300 is installed that receives the reference channel signal Ch1 as the reference signal, and receives another channel signal at the same time.

The skew adjusting circuit 1000 further comprises a charge pump 200 that receives the Up signal of the phase comparator 300; a filter 600 that receives the output of the charge pump 200; and an analog-to-digital converter (abbreviated to ADC from now on) 900 that receives the analog output of the filter 600 along with the reference channel signal Ch1 serving as a clock signal.

The skew adjusting circuit 1000 further comprises a decoder 500 supplied with the output of the ADC 900; and a latch circuit 800 that receives the skew mode signal as its clock signal, and the output of the decoder 500 as its data input.

The skew adjusting circuit 1000 further comprises a selector 700 that receives the output of the latch circuit 800 as its control signal, receives the tap outputs of the delay generating circuit 100, and outputs the skew corrected signal Ch1' of the reference channel signal Ch1.

Likewise, the skew adjusting circuit 1000 further comprises a charge pump 200m that receives the Down signal of the phase comparator 300. It further comprises a filter 600m that receives the output of the charge pump 200m; and an ADC 900m that receives the analog output of the filter 600m along with the reference channel signal Ch1 serving as its clock signal.

The skew adjusting circuit 1000 further comprises a decoder 500m supplied with the output of the ADC 900m; and a latch circuit 800m that receives the skew mode signal as its clock signal, and the output of the decoder 500m as its data input.

The skew adjusting circuit 1000 further comprises a selector 700m that receives the output of the latch circuit 800m as its control signal, receives the tap outputs of the delay generating circuit 100m, and outputs the skew corrected signal Chm' of the channel signal Chm.

As for the operation of the skew adjusting circuit 1000, all the channels are provided with the phase comparators 300–300m at their input stages. The phase comparators 300–300m each receive the reference channel signal Ch1 as their reference signal and the channel signal as the compared signal.

In the present embodiment 7, the phase comparator 300 detects the phase difference between the reference channel signal Ch1 and the channel signal Chm.

When the phase of the channel signal Chm lags behind the reference channel signal Ch1, the phase comparator 300 outputs the Up signal corresponding to the skew amount. In contrast, when the phase of the channel signal Chm leads the reference channel signal Ch1, the phase comparator 300 outputs the Down signal corresponding to the skew amount.

The phase comparator 300 supplies the phase shift information to the charge pumps 200 and 200m for converting the phase shift information into current information.

The charge pumps 200 and 200m supply their outputs to the filters 600 and 600m for converting the current information into voltage information.

The skew information converted into the voltage information is supplied to the ADCs 900 and 900m, each for converting the analog voltage into digital information.

The ADCs 900 and 900m supply the decoders 500 and 500m with the digital phase shift information.

Figure 13:
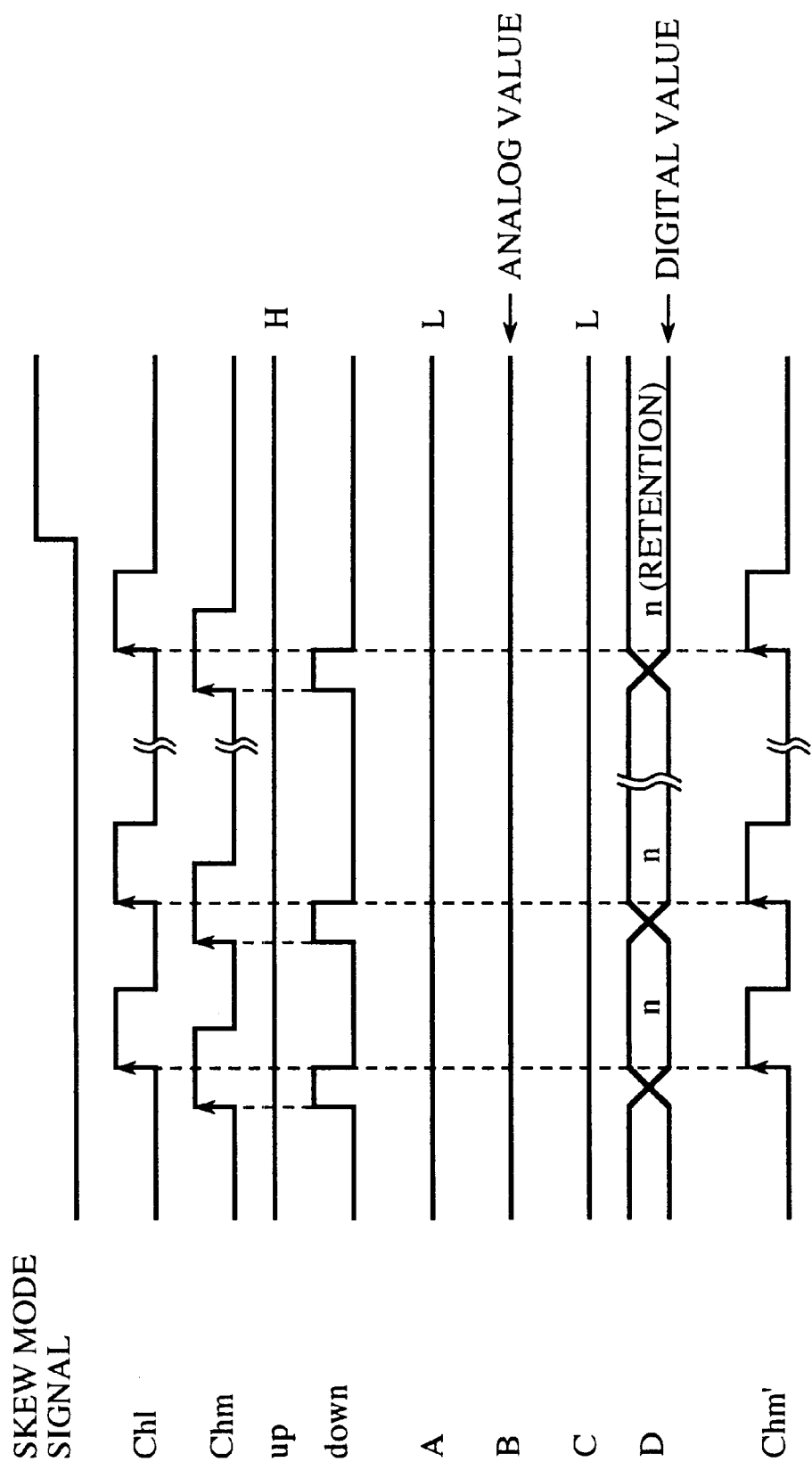
FIG. 13 is a timing chart illustrating the operation of the skew adjusting circuit of the embodiment 7.

FIG. 13 is a timing chart illustrating the operation of the skew adjusting circuit 1000. In FIG. 13, the skew mode signal is set at the "L" level during the skew adjusting period, during which the latch circuits 800 and 800m are placed at the through state. Thus, while the skew mode signal is at the "L" level, the outputs of the decoders 500 and 500m are supplied through to the selectors 700 and 700m. The skew adjustment is carried out throughout the period.

It is necessary for a transmitting side to transmit signals having simultaneous rising edges to the receiving-side IC to enable the skew adjustment in the period.

For example, when the phase of the channel signal Chm lags behind the reference channel signal Ch1, that is, when the Up signal is output, the delay generating circuit 100 delays the reference channel signal Ch1 by an amount corresponding to the skew difference.

In this case, the delay generating circuit 100m outputs the channel signal Chm without delay. In other words, the phase of the reference channel signal Ch1 is matched to the phase of the channel signal whose skew is to be corrected.

In contrast, when the phase of the channel signal Chm leads the phase of the reference channel signal Ch1, that is, when the Down signal is output, the delay generating circuit 100m delays the channel signal Chm whose skew is to be corrected by the amount corresponding to the skew difference.

In this case, the delay generating circuit 100 outputs the reference channel signal Ch1 without delay.

The present embodiment 7 can implement the skew adjusting circuit facilitating the skew adjustment.

Embodiment 8

Figure 14:
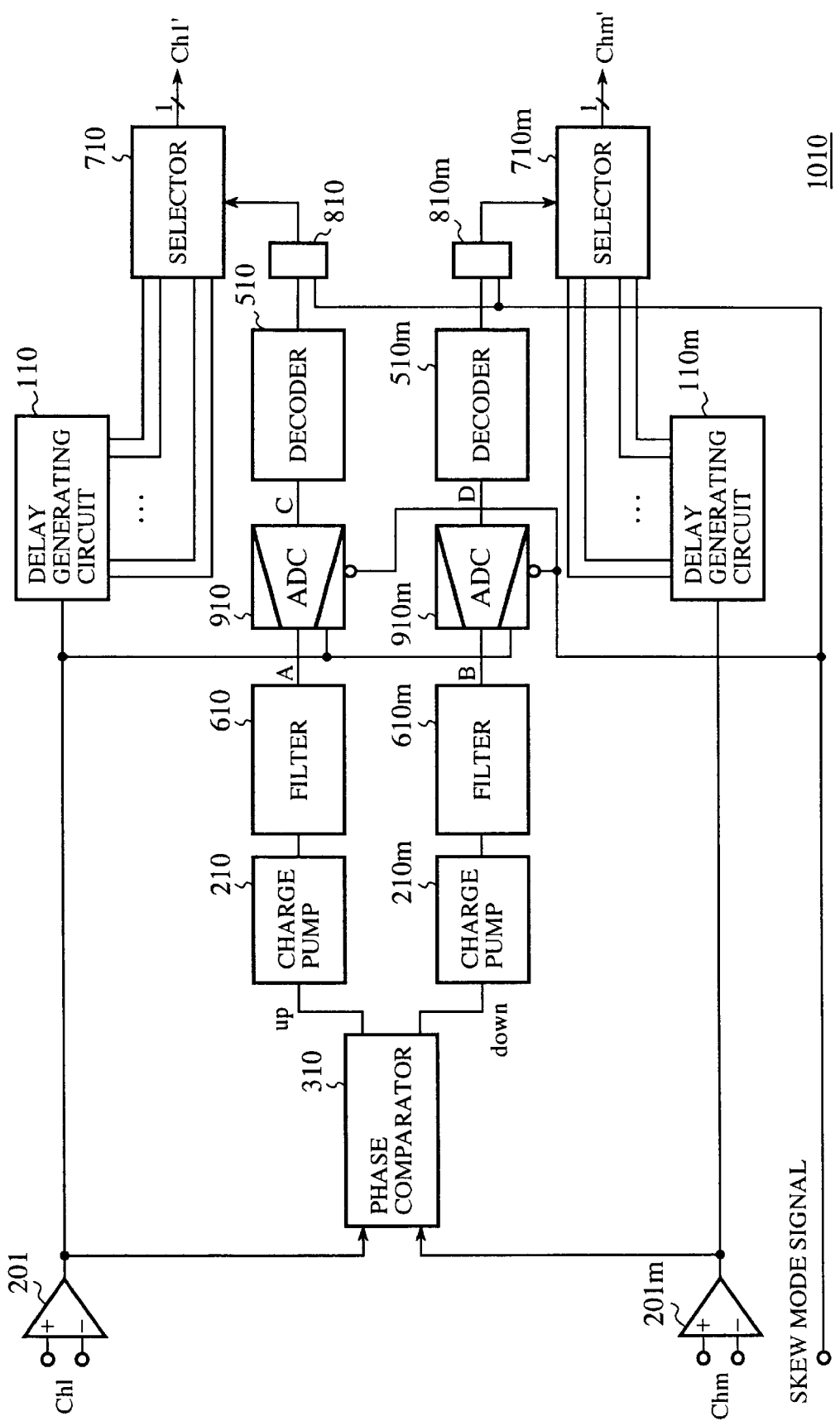
FIG. 14 is a block diagram showing a configuration of an embodiment 8 of the skew adjusting circuit in accordance with the present invention.

FIG. 14 is a block diagram showing a configuration of an embodiment 8 of the skew adjusting circuit in accordance with the present invention. In FIG. 14, the skew adjusting circuit 1010 comprises delay generating circuits 110–110m that are provided for individual channels, and include a plurality of delay elements, each of which has the same delay amount.

The skew adjusting circuit of FIG. 14 carries out the skew adjustment not among many channels, but between the two channels whose input stages include a phase comparator.

For example, a phase comparator 310 is installed that receives the reference channel signal Ch1 as the reference signal, and receives another channel signal at the same time.

The skew adjusting circuit 1010 further comprises a charge pump 210 that receives the Up signal of the phase comparator 310; a filter 610 that receives the output of the charge pump 210; and an ADC 910 that receives the analog output of the filter 610 along with the reference channel signal Ch1 serving as a clock signal.

The skew adjusting circuit 1010 further comprises a decoder 510 supplied with the output of the ADC 910; and a latch circuit 810 that receives the skew mode signal as its clock signal, and the output of the decoder 510 as its data input.

The skew adjusting circuit 1010 further comprises a selector 710 that receives the output of the latch circuit 810 as its control signal, receives the tap outputs of the delay generating circuit 110, and outputs the skew corrected signal Ch1' of the reference channel signal Ch1.

Likewise, the skew adjusting circuit 1010 comprises a charge pump 210m that receives the Down signal of the phase comparator 310. It further comprises a filter 610m that receives the output of the charge pump 210m; and an ADC 910m that receives the analog output of the filter 610m along with the reference channel signal Ch1 serving as its clock signal.

The skew adjusting circuit 1010 further comprises a decoder 510m supplied with the output of the ADC 910m; and a latch circuit 810m that receives the skew mode signal as its clock signal, and the output of the decoder 510m as its data input.

The skew adjusting circuit 1010 further comprises a selector 710m that receives the output of the latch circuit 810m as its control signal, receives the tap outputs of the delay generating circuit 110m, and outputs the skew corrected signal Chm' of the channel signal Chm.

The skew adjusting circuit 1010 further comprises differential input circuits 201–201m that are provided for individual channels, receive differential channel signals from the outside (from a circuit other than the skew adjusting circuit 1010), and supply channel signals to the delay generating circuits 110–110m.

In other words, the skew adjusting circuit 1010 is an inter-channel skew adjusting circuit including the differential input circuits, which is applicable to the differential interface such as the LVDS.

As for the operation of the skew adjusting circuit 1010, the differential input circuits 201–201m with the foregoing configuration convert the differential signals to single-ended signals, and supply the single-ended signals to the delay generating circuits 110–110m.

Accordingly, the operation of the present embodiment 8 is the same as that of the embodiment 7 after the outputs of the differential input circuits 201–201m.

The present embodiment 8 can implement operation faster than that of the embodiment 7.

Embodiment 9

In the present embodiment 9 of the skew adjusting circuit (not shown), each of the delay generating circuits 110–110m as shown in FIG. 14 includes the delay elements consisting of the differential circuits as shown in FIG. 8.

As for the operation of the skew adjusting circuit of the present embodiment 9, since the delay elements of the differential delay generating circuits 110–110m are composed of operational amplifiers that amplify the differential voltage between the two inputs, they can detect the differential voltages in spite of external noise imposed on the signal lines, thereby making it possible to implement highly accurate delay lines.

Furthermore, they can implement faster operation than the inverting type delay elements because their signals do not swing in their full range.

The present embodiment 9 can implement a low-noise, high-speed skew adjusting circuit.

Embodiment 10

The present embodiment 10 of the skew adjusting circuit (not shown) includes the delay generating circuits 110–110m as shown in FIG. 14 with the bias circuits such as those shown in FIG. 10 (designated by Ba–Bn in FIG. 10) to increase the delay of the individual delay elements.

The present embodiment 10 can implement a system applicable to the differential transmission like the LVDS used for a high-speed data transmission system that can correct the skew amounting to about one bit.

As for the operation of the skew adjusting circuit of the present embodiment 10, the delay amounts of the delay generating circuits 110–110m are determined by delay amount setting voltages determined by the divided voltages by the resistors that determine the delay of the delay generating circuits 110–110m themselves. To determine the delay amounts of the delay generating circuits 110–110m by only the delay amount setting voltages, it is necessary for the PMOS transistors M1a and M1b–M1n and the NMOS transistors M2a and M2b–M2n to be biased to their saturation regions.

The present embodiment 10 enables the delay amount from the reference channel signal Ch1 to the skew corrected signal Ch1' to be increased by increasing the delay of the delay generating circuit. Since the skew corrected signal Ch1' serves as the reference signal of the skew adjustment, the present embodiment 10 can increase the adjustable skew range.

Embodiment 11

Figure 15:
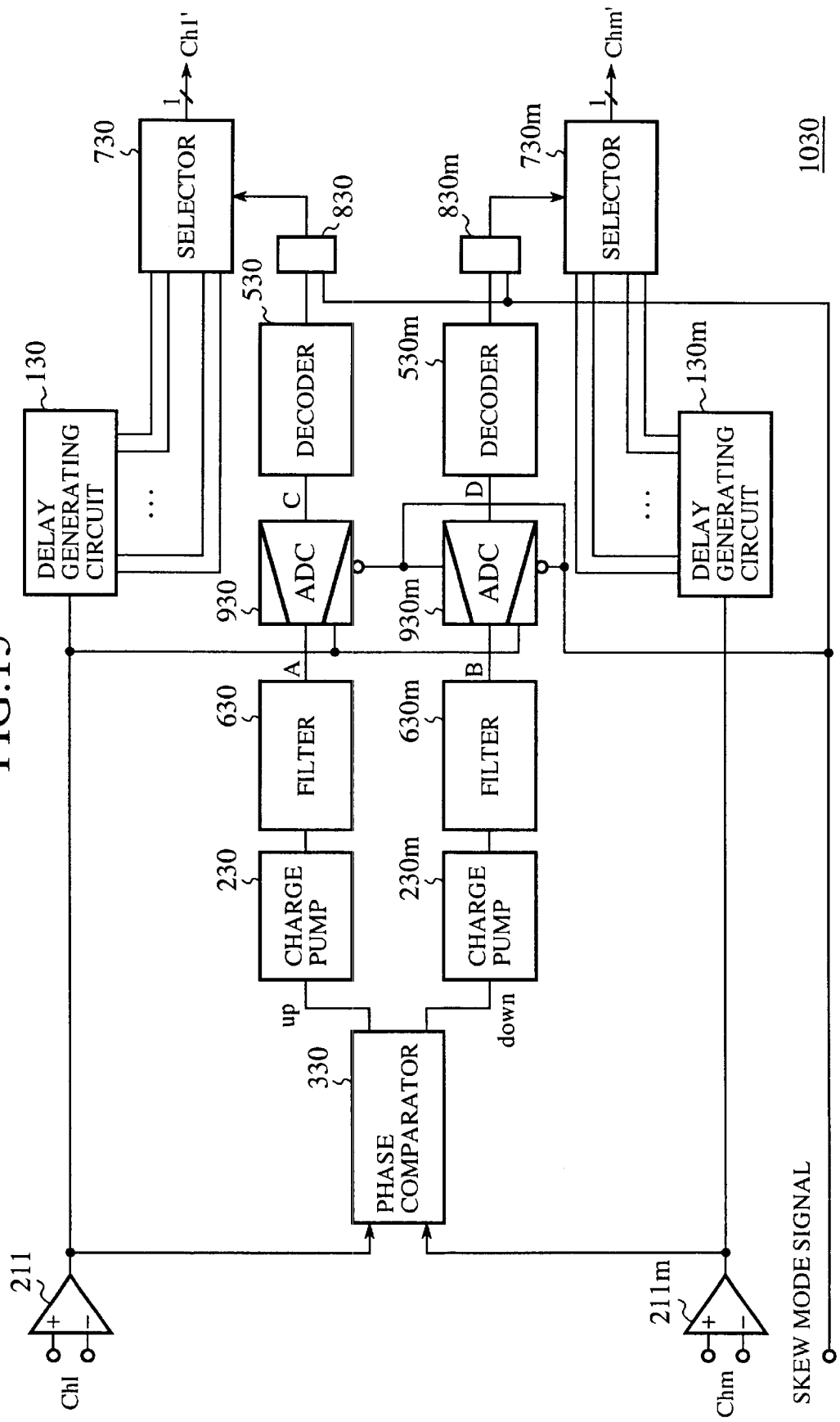
FIG. 15 is a block diagram showing a configuration of an embodiment 11 of the skew adjusting circuit in accordance with the present invention.
Figure 16:
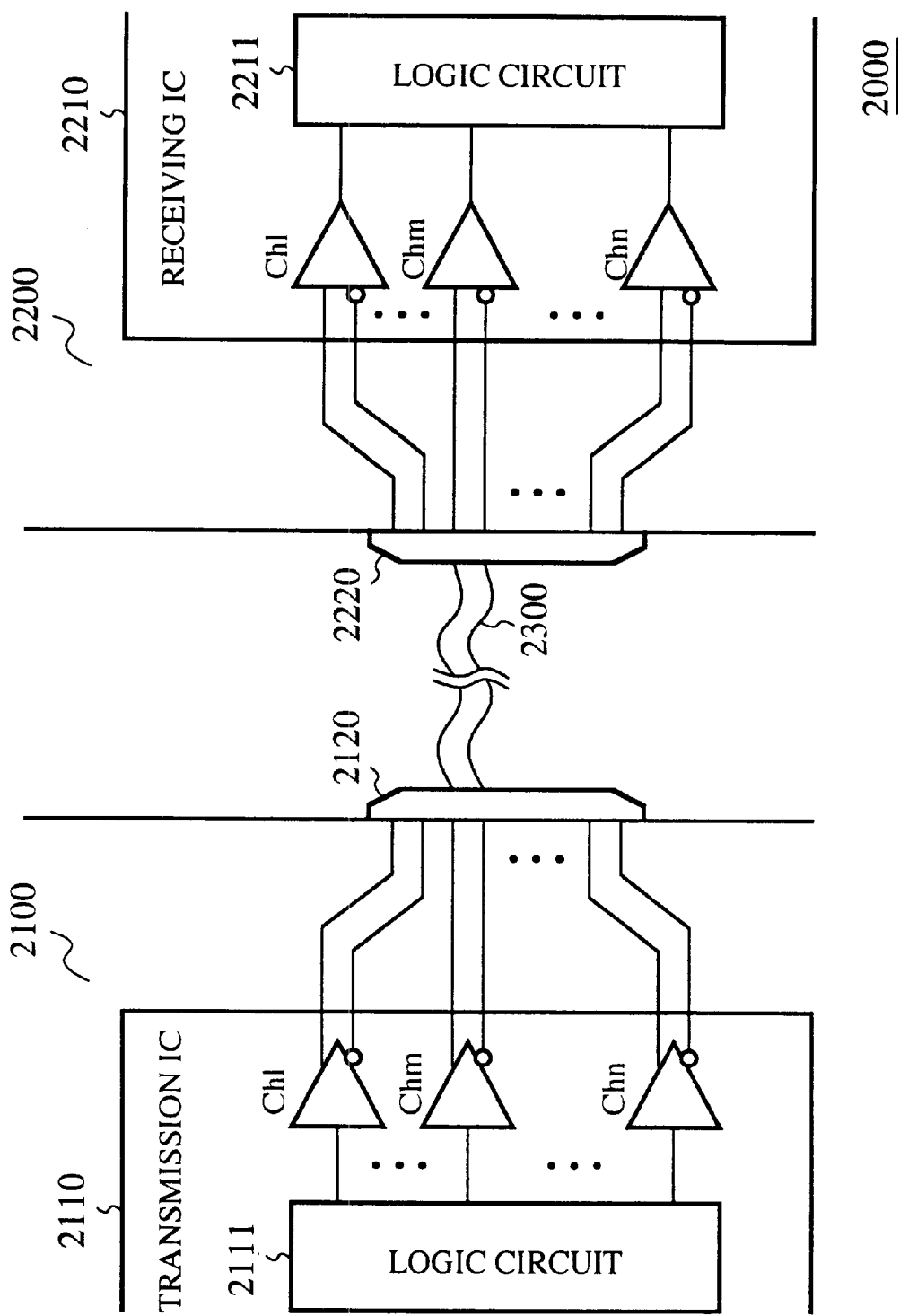
FIG. 16 is a block diagram showing a configuration of a conventional skew adjusting circuit.

FIG. 15 is a block diagram showing a configuration of an embodiment 11 of the skew adjusting circuit in accordance with the present invention. In FIG. 15, the skew adjusting circuit 1030 comprises delay generating circuits 130–130m that are provided for individual channels, and include a plurality of delay elements, each of which has the same delay amount.

The skew adjusting circuit of FIG. 15 carries out the skew adjustment not among many channels, but between the two channels whose input stages include a phase comparator.

For example, a phase comparator 330 is installed that receives the reference channel signal Ch1 as the reference signal, and receives another channel signal at the same time.

The skew adjusting circuit 1030 further comprises a charge pump 230 that receives the Up signal of the phase comparator 330; a filter 630 that receives the output of the charge pump 230; and an ADC 930 that receives the analog output of the filter 630 along with the reference channel signal Ch1 serving as a clock signal.

The skew adjusting circuit 1030 further comprises a decoder 530 supplied with the output of the ADC 930; and a latch circuit 830 that receives the skew mode signal as its clock signal, and the output of the decoder 530 as its data input.

The skew adjusting circuit 1030 further comprises a selector 730 that receives the output of the latch circuit 830 as its control signal, receives the tap outputs of the delay generating circuit 130, and outputs the skew corrected signal Ch1' of the reference channel signal Ch1.

Likewise, the skew adjusting circuit 1030 comprises a charge pump 230m that receives the Down signal of the phase comparator 330. It further comprises a filter 630m that receives the output of the charge pump 230m; and an ADC 930m that receives the analog output of the filter 630m along with the reference channel signal Ch1 serving as its clock signal.

The skew adjusting circuit 1030 further comprises a decoder 530m supplied with the output of the ADC 930m; and a latch circuit 830m that receives the skew mode signal as its clock signal, and the output of the decoder 530m as its data input.

The skew adjusting circuit 1030 further comprises a selector 730m that receives the output of the latch circuit 830m as its control signal, receives the tap outputs of the delay generating circuit 130m, and outputs the skew corrected signal Chm' of the channel signal Chm.

The skew adjusting circuit 1030 further comprises differential input circuits 211–211m that are provided for individual channels, receive differential channel signals from the outside (from a circuit other than the skew adjusting circuit 1030), and supply channel signals to the delay generating circuits 130–130m.

The present embodiment 11 can implement a system applicable to the differential transmission like the LVDS used for a high-speed data transmission system that can carry out the skew adjustment at every 1/5 step of a one-bit pattern.

The skew adjusting circuit 1030 is characterized by increasing the delay elements of the delay generating circuits 130–130m. The number of the delay elements is increased to enable the inter-channel variations of the skew adjusting circuit to be adjusted more finely because a smaller skew adjusting step, that is, a smaller minimum pitch of the adjustment, enables finer adjustment.

In addition, since an increasing number of the delay elements of the delay generating circuits 130–130m increases the number of the delay lines selectable by the decoders, it can make the adjustable pitch smaller.

The present embodiment 11 can implement a skew adjusting circuit capable of increasing the steps of the skew adjustment.

What is claimed is:

1. A skew adjusting circuit comprising:
   a plurality of delay generating circuits, each of which is provided to one of channels, and includes a plurality of delay elements, each of the delay elements having a same delay amount;
   a plurality sets of flip-flops, each set of which is provided to one of said plurality of delay generating circuits except for a first delay generating circuit corresponding to a reference channel signal, said flip-flops of each set receive an output of a final delay element of the first delay generating circuit as a clock signal, and receive tap outputs of associated one of said plurality of delay generating circuits;
   a plurality of decoders, each of which receives outputs of said flip-flops of one of said plurality of sets of flip-flops; and
   a plurality of selectors, each of which receives an output of one of said plurality of decoders as a control signal, receives tap outputs of one of said plurality of delay generating circuits, and outputs a skew corrected signal.

2. The skew adjusting circuit according to claim 1, further comprising a plurality of latch circuits, each of which receives a skew mode signal as its clock signal, and an output of one of said plurality of decoders as its data input.

3. The skew adjusting circuit according to claim 2, further comprising a plurality of differential input circuits, each of which is provided to one of the channels, receives an external differential channel signal, and supplies its output to one of said plurality of delay generating circuits.

4. The skew adjusting circuit according to claim 3, wherein each of said differential input circuits comprises:
   a first first conductivity type MOS transistor having its source connected to a first fixed potential terminal;
   a first second conductivity type MOS transistor having its drain connected to a drain of said first first conductivity type MOS transistor, and its gate connected to a non-inverting input terminal of said differential input circuit;
   a second first conductivity type MOS transistor having its source connected to said first fixed potential terminal, its gate connected to the gate of said first first conductivity type MOS transistor, and its drain connected to its gate;
   a second second conductivity type MOS transistor having its drain connected to a drain of said second first conductivity type MOS transistor, and its gate connected to an inverting input terminal of said differential input circuit;
   a third second conductivity type MOS transistor having its source connected to a second fixed potential terminal, its drain connected to a source of said first second conductivity type MOS transistor and to a source of said second second conductivity type MOS transistor;
   a resistor having its first end connected to said first fixed potential terminal; and a fourth second conductivity type MOS transistor having its source connected to said second fixed potential terminal, its drain connected to a second end of said resistor, and its gate connected to its drain and to a gate of said third second conductivity type MOS transistor.

5. The skew adjusting circuit according to claim 3, wherein each of said plurality of delay generating circuits consists of a differential delay generating circuit that is supplied with an external differential channel signal, amplifies a difference voltage across its two input terminals, and outputs a voltage corresponding to the difference voltage.

6. The skew adjusting circuit according to claim 5, wherein each of said differential delay generating circuit comprises delay elements, each of which includes an operational amplifier.

7. The skew adjusting circuit according to claim 5, wherein each of said differential delay generating circuit comprises:
   a plurality of first resistors having their first ends connected to a first fixed potential terminal;
   a plurality of second resistors having their first ends connected to said first fixed potential terminal, each of said plurality of second resistors being paired with one of said plurality of first resistors;
   a plurality of first NMOS transistors, each of which has its drain connected a second end of one of said plurality of first resistors;
   a plurality of second NMOS transistors, each of which has its drain connected to a second end of one of said plurality of second resistors;
   a plurality of third NMOS transistors, each of which has its source connected to a second fixed potential terminal, and its drain connected to sources of said first and second NMOS transistors that are paired;
   a third resistor having its first end connected to said first fixed potential terminal; and
   a fourth NMOS transistor having its source connected to said second fixed potential terminal, its drain connected to a second end of said third resistor, and its gate connected to gates of said plurality of third NMOS transistors.

8. The skew adjusting circuit according to claim 3, wherein each of said plurality of delay generating circuits includes a plurality of bias circuits for adjusting the delay amount of said delay elements.

9. The skew adjusting circuit according to claim 3, wherein each of said plurality of delay generating circuits comprises:
   a delay adjuster including a first resistor having its end connected to a first fixed potential terminal, a second resistor having its first end connected to a second end of said first resistor, and a third resistor having its first end connected to a second end of said second resistor and its second end connected to a second fixed potential terminal;
   a plurality of first conductivity type MOS transistors, each of which has its source connected to said first fixed potential terminal, and its gate connected to a connecting point of said first resistor and said second resistor;
   a plurality of bias circuits, each of which is connected to a drain of one of said plurality of first conductivity type MOS transistors; and
   a plurality of second conductivity type MOS transistors, each of which has its source connected to said second fixed potential terminal, its drain connected to one of said plurality of bias circuit, and its gate connected to a connecting point of said second resistor and said third resistor.

10. The skew adjusting circuit according to claim 3, wherein each of said delay generating circuits includes an increasing number of delay elements and an increasing number of flip-flops corresponding to said delay elements.

11. A skew adjusting circuit comprising:
   a plurality of delay generating circuits, each of which is provided to one of channels, and includes a plurality of delay elements, each of the delay elements having a same delay amount;
   at least one phase comparator that receives a reference channel signal and another channel signal;
   at least one first charge pump that receives an Up signal from said phase comparator;
   at least one first filter that receives an output of said first charge pump;
   at least one first ADC (analog-to-digital converter) that receives an output of said first filter as an analog input, and receives the reference channel signal as a clock signal;
   at least one first decoder that receives an output of said first ADC;
   at least one first latch circuit that receives a skew mode signal as a clock signal, and an output of said first decoder as a data input;
   at least one first selector that receives an output of said first latch circuit as a control signal, receives tap outputs of one of said plurality of delay generating circuits, and outputs a skew corrected signal of said reference channel signal;
   at least one second charge pump that receives a Down signal from said phase comparator;
   at least one second filter that receives an output of said second charge pump;
   at least one second ADC that receives an output of said second filter as an analog input, and receives the reference channel signal as a clock signal;
   at least one second decoder that receives an output of said second ADC;
   at least one second latch circuit that receives the skew mode signal as a clock signal, and an output of said second decoder as a data input; and
   at least one second selector that receives an output of said second latch circuit as a control signal, receives tap outputs of one of said plurality of delay generating circuits, and outputs a skew corrected signal of the channel signal.

12. The skew adjusting circuit according to claim 11, further comprising a plurality of differential input circuits, each of which is provided to one of the channels, receives an external differential channel signal, and supplies its output to one of said plurality of delay generating circuits.

13. The skew adjusting circuit according to claim 12, wherein each of said plurality of delay generating circuits consists of a differential delay generating circuit that is supplied with an external differential channel signal, amplifies a difference voltage across its two input terminals, and outputs a voltage corresponding to the difference voltage.

14. The skew adjusting circuit according to claim 13, wherein each of said differential delay generating circuits comprises delay elements, each of which includes an operational amplifier.

15. The skew adjusting circuit according to claim 12, wherein each of said plurality of delay generating circuits includes a plurality of bias circuits for adjusting the delay amount of said delay elements.

16. The skew adjusting circuit according to claim 12, wherein each of said delay generating circuits includes an increasing number of delay elements and an increasing number of flip-flops corresponding to said delay elements.

* * * * *